United States Patent
Bacchetta et al.

(10) Patent No.: US 6,531,714 B1
(45) Date of Patent: *Mar. 11, 2003

(54) PROCESS FOR THE PRODUCTION OF A SEMICONDUCTOR DEVICE HAVING BETTER INTERFACE ADHESION BETWEEN DIELECTRIC LAYERS

(75) Inventors: Maurizio Bacchetta, Cologno Monzese (IT); Luca Zanotti, Crema (IT); Giuseppe Queirolo, Milan (IT)

(73) Assignee: SGS-Thomson Microelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,065

(22) Filed: Dec. 14, 1998

Related U.S. Application Data

(62) Division of application No. 08/577,125, filed on Dec. 22, 1995, now Pat. No. 6,153,537.

(30) Foreign Application Priority Data

Dec. 30, 1994 (EP) .............................. 94830591

(51) Int. Cl.$^7$ ................. H10K 31/0312; B32B 9/00
(52) U.S. Cl. ............... 257/77; 428/212; 428/336; 428/408; 428/446; 428/698; 428/701; 428/702
(58) Field of Search ................... 428/446, 698, 428/701, 408, 336, 212, 702; 257/77, 76

(56) References Cited

U.S. PATENT DOCUMENTS 4,581,627 A * 4/1986 Ueda et al. ............... 37/67

(List continued on next page.)

FOREIGN PATENT DOCUMENTS

| EP | A-0 274 274 | 7/1988 | ........... C23C/28/00 |
| EP | A-0 627 763 | 12/1994 | ........... H01L/21/31 |
| GB | 2 083 948 | * 3/1982 | |
| GB | 2 167 901 | * 6/1986 | |
| WO | 91-11822 | * 8/1991 | |

OTHER PUBLICATIONS

European Search from European Patent Application 94830591.7, filed Dec. 30, 1994.

(List continued on next page.)

*Primary Examiner*—Archene Turner
(74) *Attorney, Agent, or Firm*—Wolf, Greenfield & Sacks, P.C.; James H. Morris; William R. McClellan

(57) ABSTRACT

A method for manufacturing a semiconductor device having improved adhesion at an interface between layers of dielectric material, comprising the steps of forming a first layer of dielectric material on at least one part of a structure defined in a semiconductor substrate and forming a second dielectric material layer superimposed on the least one part of the first layer. The method further includes the step of forming, in the part where the first and second layers are superimposed, an intermediate adhesion layer comprising a ternary compound of silicon, oxygen and carbon. The formation of the adhesion layer takes place at low temperature and in an atmosphere kept essentially free of oxidative substances different from those serving to provide the silicon and the carbon to the layer. Preferably the layer is formed by the plasma enhanced chemical vapour deposition technique. The ternary dielectric compound of silicon, oxygen and carbon obtained is preferably useful to aid in adhesion between layers of dielectric materials, particularly in semiconductor devices. Alternatively, in another embodiment of the invention, in a process which is more generally useful for deposition of a dielectric material layer comprising silicon, the layer is formed at low temperature by the chemical vapour deposition technique, preferably plasma enhanced, in an atmosphere kept essentially free of exogenous oxidative substances, (i.e., in which the oxidizer is contained in the molecules used to provide the species of atoms other than oxygen comprised in the layer).

19 Claims, 6 Drawing Sheets

U.S. PATENT DOCUMENTS

| | | | | |
|---|---|---|---|---|
| 4,772,927 A | * | 9/1988 | Saito et al. | |
| 5,376,590 A | * | 12/1994 | Machida et al. | 437/235 |
| 5,380,553 A | * | 1/1995 | Loboda | 427/226 |
| 5,413,952 A | * | 5/1995 | Pages et al. | 437/62 |
| 5,554,570 A | * | 9/1996 | Maeda et al. | 437/235 |
| 5,583,369 A | * | 12/1996 | Yamazaki et al. | |
| 5,627,403 A | * | 5/1997 | Bacchetta et al. | 257/639 |
| 5,635,425 A | * | 6/1997 | Chen | 438/631 |
| 5,825,078 A | * | 10/1998 | Michael | |
| 5,854,494 A | * | 12/1998 | Yamazaki et al. | |
| 5,855,693 A | * | 1/1999 | Murari et al. | 148/33.3 |
| 5,894,151 A | * | 4/1999 | Yamazaki et al. | |
| 5,962,869 A | * | 10/1999 | Yamazaki et al. | |

OTHER PUBLICATIONS

Patent Abstracts of Japan, vol. 18, No. 518 (E–1612) Sep. 29, 1994 & JP–A–06 181 201 (Kawasaki Steel) & Database WPI, Week 9430, Derwent Publications Ltd., London, GB; AN 94–246345 & JP–A–6 181 201.

Patent Abstracts of Japan, vol. 14, No. 491 (M–1040) Oct. 25, 1990 & JP–A–02 200 454 (NEC) & Database WPI, Week 9038, Derwent Publications Ltd., London, GB; AN 90–285971 & JP–A–2 200 454.

* cited by examiner

PROCESS FOR THE PRODUCTION OF A SEMICONDUCTOR DEVICE HAVING BETTER INTERFACE ADHESION BETWEEN DIELECTRIC LAYERS

This application is a division of Ser. No. 08/577,125 filed Dec. 22, 1995 now U.S. Pat. No. 6,153,537.

BACKGROUND OF THE INVENTION

1. Field of the Invention

The present invention relates to a method for manufacturing a semiconductor device having improved adhesion at the interface between layers of dielectric material. The present invention also relates to a semiconductor device achievable by this method. The present invention further relates to a ternary dielectric compound of silicon, oxygen and carbon, and particularly for use as an adhesion layer between superimposed dielectric materials as well as to a process for producing this ternary dielectric compound.

2. Discussion of the Related Art

In present electronic and optoelectronic technology, the importance of the dielectric materials used in the realization of so-called semiconductor devices is well known. By the term "semiconductor", it is meant a device whose operation utilizes the physical properties of a semiconductor material which is a constitutive part of it. A semiconductor device can, for example, include in the microelectronics field one or more integrated electronic circuits formed in a semiconductor material.

In a semiconductor device, layers of dielectric materials have insulation functions, electrical and thermal, between different zones of the device or between the device and the external environment and/or act as barriers for contaminating substances coming from the external environment. Typical dielectric materials in the specific field of microelectronics, (i.e. of integrated circuits), are silicon oxides, doped or undoped, silicon oxynitrides and silicon nitrides.

In the structure of an integrated circuit, a certain number of layers of dielectric material are commonly superimposed. In the different manufacturing steps of the integrated electronic device these layers, identical or different in composition, are formed in succession. This happens, for example, in some passivation steps, final, intermediate or intermetal, (i.e., between two metallization levels of the device). The insulating ability of a multilayer dielectric is greater than that of a single layer. Often, there are intermediate operations performed after formation of a layer and before formation of the next layer. For example, a sacrificial layer is formed which is then totally or partly removed, or it is the first layer which is partially removed. In any case, the successive layer has portions of surface at least partially in contact with the immediate underlying layer or layers.

For good operation of the circuit and hence integrity of the semiconductor device, it is preferable that the layers of dielectric material be very adherent in the contact zones. However, as known, in present technology it sometimes happens that the layers of superimposed dielectric materials exhibit adhesion problems and tend to detach themselves. This phenomenon is known as peeling.

The cause of this problem is not yet sufficiently clear or complete to those skilled in the art. However, the problem of poor adhesion exists primarily due to the fact that the materials are in the form of layers. Each material in layer form exhibits an internal stress which causes curving of the layer when superimposed on another layer. If the stress is particularly high so as to generate forces at the interface which are greater than the adhesion forces between the layers, peeling occurs.

A very important cause of the failed adhesion is the present techniques for layer formation. Conventionally, the layers of dielectric material except the first, which commonly can be obtained thermally, are formed by deposition. The technique most commonly used is chemical deposition in vapour phase, known as CVD (Chemical Vapour Deposition). Chemical precursors of the elements which are to be deposited are reacted in the gaseous state in a reactor. Usually a chemical precursor is used for each of the elements included in the compound to be formed.

A dielectric deposited by the CVD technique is not perfectly uniform in structure and composition along the direction of deposition even if the process parameters are well controlled. In particular if the Plasma Enhanced CVD (PECVD) technique is used in the first stages of the deposition, in which a specific reactor is used and the reactive species are generated in the form of plasma in the reaction chamber, the parameters of deposition are not fully controllable. Between ignition of the plasma and the stationary state of operation of the reactor, there is a brief period of settlement before the deposition speed reaches steady state. The structural and compositional non-uniformity in the surface regions obstructs adhesion of the successive layer to the surface on which the deposition takes place.

In addition, it is necessary to consider that saturation of the surface bonds due to the presence of spurious atoms or even mere interruption of the deposition process makes adhesion with the successive layer more difficult. This can happen, for example, in the case where the free surface has been subjected to a previous treatment such as a chemical etching for removal of a sacrificial layer before deposition of the successive layer.

The different manufacturing steps of the device fulfill another important role in aggravating the adherence difficulties. Mechanical stresses generate internal stress, for example, during a separation phase of the individual devices on a semiconductor chip by cutting the semiconducting chip on which the different integrated circuits are formed. In addition, allowance must be made for temperature variations and attacks of contaminants from the external environment which can occur during the circuit manufacturing cycle. These effects tend to degrade the interlayer bonds.

It is known experimentally that the lack of adhesion is more or less acute depending on the composition and structure of the materials making up the layers. Therefore, known techniques for improving adhesion must be chosen differently depending on the composition of the layers in contact and on the process, which the surface on which the deposition takes place, has been exposed.

In the case where the materials are doped or undoped silicon oxides to increase adhesion between the layers of dielectric materials, some known techniques consist of treating the free surface where the deposition takes place.

In order to ensure adhesion between the layers of a semiconductor device, it has been proposed to mechanically increase the roughness of the surface and, hence, the gripping area for the reagents to be deposited. One known solution calls for bombardment of the surface by a sputtering technique with nitrogen or inert gas ions (e.g., argon) in plasma. This solution is commonly applied for silicon oxides and in particular for silicon oxides deposited using TEOS (tetraethylorthosilicate) as the chemical precursors for the silicon.

Another solution proposed by the prior art is appropriate in the case where the surface incorporates spurious chemical elements (e.g., residues of a previous etching process). In this case, to improve the chemical uniformity of the interface, cleaning is performed by chemical etching in plasma (dry etching) with ions of various types (e.g., oxygen or mixtures of $N_2$ and $NH_3$) or in solution (wet etching).

These techniques, optionally used in succession, are not, however, sufficiently effective to prevent detachment of adjacent layers when they include silicon oxynitrides and silicon nitrides. These materials exhibit a particularly high intrinsic stress, and therefore, the above mentioned mechanical and chemical methods for improvement of the deposition surface are not effective.

Where the adjacent layers include silicon oxynitrides and silicon nitrides it has been proposed (e.g., as described in European patent application EP-A-0627763 of this applicant) to interpose a layer of oxide between adjacent layers of dielectric material and in particular either doped or undoped silicon dioxide (i.e., stoichiometric silicon oxide). This technique exhibits the disadvantage of being effective mainly where the layers of dielectric material consist of silicon nitrides and oxynitrides. This technique in particular is ineffective if used for silicon oxide layers.

Accordingly, at least in part, the technical problem underlying the present invention is to ensure effective adhesion between layers of a semiconductor device regardless of the chemical composition thereof and of the characteristics of their surfaces.

SUMMARY OF THE INVENTION

In one aspect, the technical problem underlying the present invention is solved by a method for manufacturing a semiconductor device with improved adhesion at an interface between layers of dielectric material by formation of an adhesion layer comprising a non-stoichiometric silicon oxide incorporating a certain percentage of carbon.

In accordance with the present invention, it has been surprisingly found that the presence of carbon in the adhesion layer achieves effective adhesion between a first dielectric material layer and a second dielectric material layer superimposed in a semiconductor device, regardless of the chemical composition and the surface condition of the layers.

In a preferred embodiment, this layer is formed at low temperature and in an atmosphere kept essentially free from exogenous oxidative substances before formation of the second dielectric layer. By "exogenous oxidative substances" it is herein meant oxidative substances, in particular oxygen, which do not come from the same molecules providing the silicon and the carbon for the layer.

In a preferred embodiment, this adhesion layer is thin compared to the thicknesses of the two layers of dielectric material between which it is located.

BRIEF DESCRIPTION OF THE DRAWINGS

The characteristics and advantages of the present invention are set forth in the description of an embodiment thereof given below by way of non-limiting example with reference to the annexed drawings, in which.

DETAILED DESCRIPTION

Figure 1:
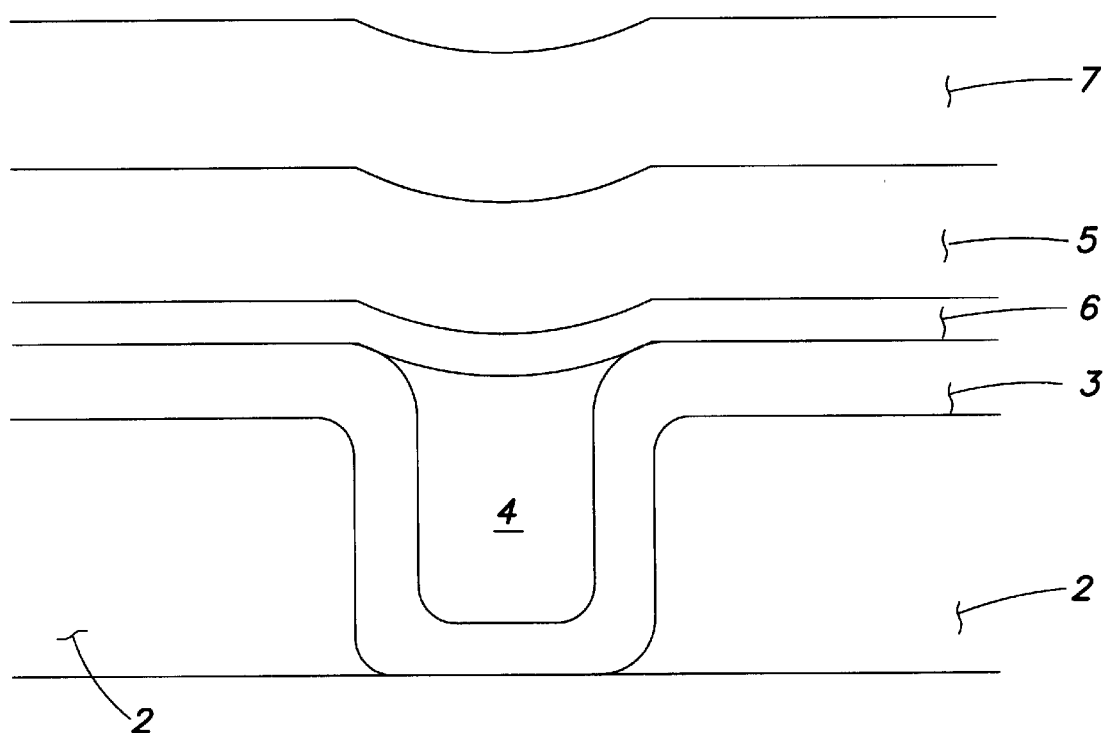
FIG. 1 shows a cross-sectional view of a semiconductor device including an adhesion layer in accordance with the present invention.

In accordance with the present invention in the field of integrated semiconductor electronic devices, a method for manufacturing a device with improved adhesion at an interface between layers of dielectric material initially comprises standard operations for manufacturing integrated circuits. An integrated circuit structure is formed in a semiconductor material substrate (e.g., monocrystalline silicon). The term "structure" as used herein refers to, for example, an integrated circuit at the end of its formation (i.e., after formatting the metallization strips). However, it is to be appreciated that the method, according to the present invention, can be used at any stage of known manufacturing methods. Usually a structure includes layers of conductive material in its upper parts.

A first layer of protective dielectric material is superimposed on the structure and conforms to the structure itself. The dielectric material can be, for example, silicon oxide, silicon nitride or silicon oxynitride, depending on the function it is to fulfill. It is known, for example, that silicon oxynitrides and silicon nitrides serve adequately as a barrier against diffusion of water and sodium from the outside into the device. For this reason, layers of silicon oxynitrides and silicon nitrides are commonly used in the field of devices encapsulated in plastic packages which, as known, do not insulate against moisture and other external contaminants.

Formation of the first dielectric material layer takes place in the conventional manner, usually by means of one of the techniques of low pressure chemical vapour deposition (LPCVD), atmospheric pressure chemical vapour deposition (APCVD), subatmospheric pressure chemical vapour deposition (SACVD), or by plasma enhancement chemical vapor deposition (PECVD).

Intermediate operations can be performed successively as described above (e.g., formation of a sacrificial layer with successive etching of the layer itself or only partial etching of the dielectric layer). Within the scope of the present invention, the surface on which the successive layer will be formed has at least one zone in which portions of the first dielectric material layer remain uncovered.

Next, a second dielectric material layer is formed by techniques analogous to those for formation of the first dielectric material layer. This second layer is superimposed on the first layer at least in the aforementioned zone.

In accordance with the present invention, prior to formation of the second layer, a thin dielectric adhesion layer is formed at the interface between the first and second layer. The thin dielectric layer is in contact with the first and second layers of dielectric material in at least the aforementioned zone. In accordance with the present invention, the thin dielectric adhesion layer is a ternary compound of silicon, oxygen and carbon.

For the purposes of the present invention, the adhesive layer preferably has a thickness which is less than the two layers between which it is interposed. The adhesive layer's thickness should be on the order of a few nanometers to tens of nanometers. More precisely, for practical process control reasons, there can be defined a preferential range between 5 nm and 50 nm. However, for the purpose of the present invention a minimum sufficient thickness is that corresponding to a monatomic layer (monolayer) (i.e., a thickness equal to the atomic dimensions (1 nm)).

In accordance with the present invention, the intermediate adhesion layer is obtained at a temperature of less than 500° C. and in an atmosphere kept essentially free of exogenous oxidative substances (i.e., substances which are different from those coming only from the molecule used to provide the silicon and the carbon for the layer). In accordance with the present invention, the oxidizer, for example, oxygen, used for oxidation of the silicon preferably comes from the same molecule providing the silicon and carbon.

In accordance with a preferred embodiment, the adhesion layer is formed by plasma enhanced chemical vapour deposition technique. The process temperature is preferably between 100° C. and 500° C. and the pressure between 0.2–10 Torr (0.03–1.33 kPa). The chemical precursors for the deposition are introduced into the reactor without introducing a specific precursor for the oxygen as takes place commonly when a compound containing oxygen, such as stoichiometric silicon oxide, is to be deposited.

In a preferred embodiment, a single liquid or gaseous chemical source is used which comprises the three chemical elements silicon, oxygen and carbon and optionally hydrogen. The silicon serves for formation of a dielectric of silicon and the oxygen for oxidation of the silicon. The carbon is partially liberated in the form of gas and in part incorporated in the layer.

The source used is chosen from among one of the compounds commonly used in the present art as specific precursors of silicon. Preferably it is tetraethylorthosilicate (known as TEOS) or tetramethylcyclotetrasiloxane (known also as TMCTS). These compounds commonly constitute the base for the deposition of silicon oxide together with separate oxygen sources.

In addition, all the metallic—organic molecules containing the species necessary for the deposition (i.e., silicon and oxygen) linked with carbon or other organic groups should be considered. For example

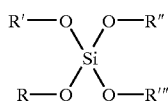

where R, R', R", R''' can be any organic group and can be the same or different, and/or other groups containing silicon, oxygen and carbon or similar molecules. The formula can be generalized by $-[O—Si—[O—Rx]_3]_n$ where Rx is an alkyl, aliphatic or aromatic group comprising preferably from 1 to 12 carbon atoms. Other such compounds are known to those skilled in the art and are intended to be within the scope of the present invention.

The composition, and in particular the percentage of carbon contained in the adhesion layer, varies depending on the molecule used as precursor and on the conditions generated in the plasma (density, temperature, energy) for formation of the layer.

The deposition in plasma can be the standard PECVD type (i.e., where a radio frequency generator is used for the production of the plasma). Other types of plasma deposition which may be used include Electron Cyclotron Resonance (ECR-PECVD) in which a microwave generator is present and cyclotron resonance or HDCVD (High Density CVD) in which a radio frequency generator and a magnetic field generator are used simultaneously to increase the plasma density.

According to the present invention, specific oxygen precursors are not included and the deposition process takes place at a relatively low temperature which permits formation of a compound in which a percentage of carbon is present. If one of the two conditions is not satisfied, as takes place in known deposition processes, the compound obtained is pure silicon oxide. Indeed, in the absence of oxygen but at high temperature around 700° C., such as using an LPCVD type deposition, the compound obtained is essentially carbon free, as described in the article by S. Rojas, A. Modelli and W. S. Wu in J. Vac. Sci. Technol. B8 (6), Nov/Dec 1990. However, the use of low temperatures and oxygen precursors corresponds to the known deposition of silicon oxide in plasma.

It should be noted that a negligible presence of exogenous oxygen in relation to the precursors which act in the deposition, (e.g., less than a few sccm for a total flow of hundreds of sccm (standard cubic centimeters per minute)), falls within the scope of the present invention and can permit modification of the composition of the layer obtained. In addition, for some molecules used as precursors, a certain amount of oxygen may be advantageous to modify the carbon concentration in the deposited layer.

Plasma enhancement in accordance with the present invention allows dissociation of the source molecules for the deposition even at the low process temperatures selected.

The adhesion layer obtained by this process comprises preferably the following concentration of atoms, in units of $10^{21}$ atoms/cm$^3$: from 15 to 27 for the silicon, from 28 to 50 for the oxygen, from 2.5 to 4.5 for the carbon. In addition, the compound can also comprise a small percentage of hydrogen, (i.e., from $0.8*10^{21}$ to $1.3*10^{21}$ atoms/cm$^3$).

The presence in this thin adhesion layer of a percentage of carbon in various proportions is decisive for ensuring adhesion between the two layers of dielectric material between which it is interposed. The adhesion has been shown to take place experimentally for every type of dielectric layer, whether silicon oxynitrides, silicon nitrides or silicon oxides. In the latter case, a layer of stoichiometric silicon oxide, used in the prior art already described, does not give satisfactory results. However, the method in accordance with the present invention is useful even for adhesion between layers of silicon oxynitrides and silicon nitrides.

The effectiveness of the method is shown by the absence of peeling between the two layers of dielectric material when the entire structure is subjected to severe stress, for example, when it is deposited over a thick layer (0.8–1.0 micrometers) of tungsten or other layers with high tensile or compressive stress.

A preferred method in accordance with the present invention does not involve additional process steps as compared with the prior art. Preferably, such a method is easy to implement using known equipment and techniques. The low process temperatures used also allow the method to be used for electronic devices which would be damaged by high temperatures. It is to be appreciated that the described method can of course be used to permit adhesion between a third dielectric material layer formed subsequently on the second layer and so on.

In one aspect of the present invention, a ternary dielectric compound is provided which is particularly suitable for use as an adhesion layer between superimposed dielectric materials as disclosed herein. Such a ternary dielectric compound includes silicon, oxygen and carbon. It is particularly, but not exclusively, useful as an adhesive compound between dielectric material layers in an integrated semiconductor electronic device. But the ternary dielectric compound can be used in other applications and structures, such as a semiconductor device for optoelectronics or for adhesion between dielectric layers, for example, in transparent or reflecting layers, in conventional optical applications.

In accordance with the present invention, a process for the deposition of a layer of dielectric compound comprising silicon is also provided. The layer is preferably produced by a chemical vapour deposition technique at low temperature and in an atmosphere kept essentially free of exogenous oxidative substances (i.e., in which the oxidizer is contained in the molecules used for providing the species of atoms included in the layer and other than oxygen). In particular, a CVD technique is used in plasma without substantial addition of chemical precursors for the oxygen.

The process has been described herein in relation to the formation of the ternary adhesion compound. However, it is to be appreciated that the type of process can be used even for the formation of different layers and, for the formation of dielectric materials comprising silicon. For example, a stoichiometric silicon oxide can be obtained by the process for forming the layer, as described herein, using a different molecule containing a greater quantity of oxygen to allow complete oxidation of the other species of atoms contained (i.e., of silicon and optionally carbon). In addition, with different molecules, containing, for example, nitrogen, deposition can be obtained (e.g., layers of silicon nitride ($Si_3N_4$) or silicon oxynitride ($SiO_xN_y$)).

FIG. 1 shows schematically a semiconductor device with improved adhesion between dielectric material layers where a method in accordance with the present invention has been used. Reference number 1 indicates a substrate of semiconductor material on which a circuit structure, indicated as a whole by 2, has been previously formed. Typically structure 2 includes a first layer of conductive material (metallization) in an upper part. Conformed to this structure is a first layer of dielectric material 3. Over layer 3, a layer 4 of planarizing material has been formed, such as SOG (Spin On Glass) in the deeper regions of the structure. A second layer of dielectric material is indicated by 5. As may be seen, between the two layers 3 and 5 a thin adhesion layer 6 is formed. Layer 6 is in contact with both layers 3 and 5 in the region over the structure 2 where there is no layer 4. A second layer of conductive material is indicated at 7.

In accordance with a preferred embodiment of the present invention, a reaction chamber is used which comprises a standard radio frequency reactor of the single wafer type. The electrode spacing was 205 mils (thousandths of an inch) and the power of the plasma reactor was 430 W. A flow of TEOS in an inert carrier gas (He), totaling as a whole 600 sccm (standard cubic centimeters per minute), was introduced into the reaction chamber without introducing oxidizing agents. The process temperature was adjusted to 390° C. (set point) and the pressure was adjusted to 9 Torr (1.20 kPa).

Figure 2:
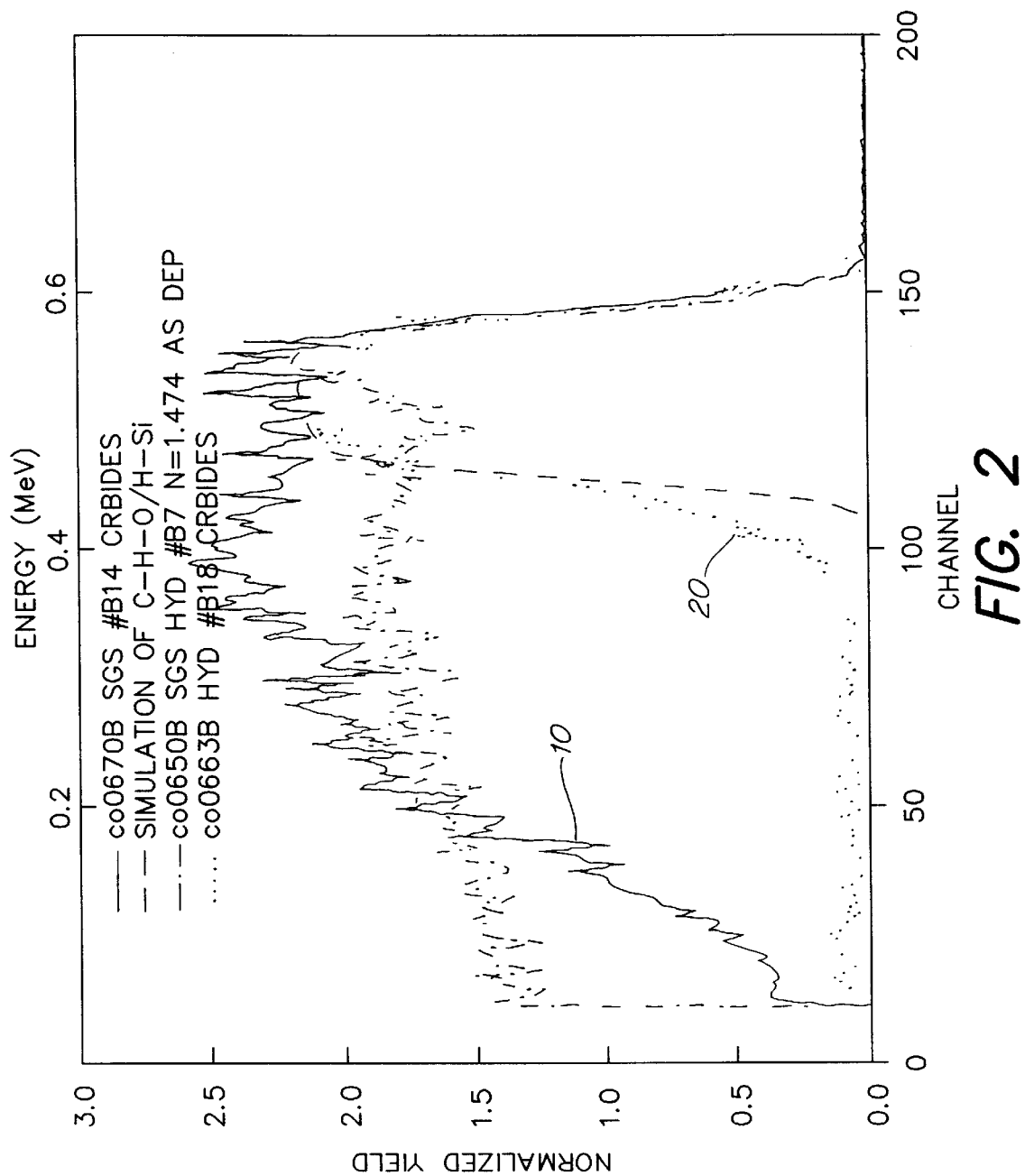
FIG. 2 shows ERDA spectra of two samples of an adhesion layer in accordance with the present invention.
Figure 3:
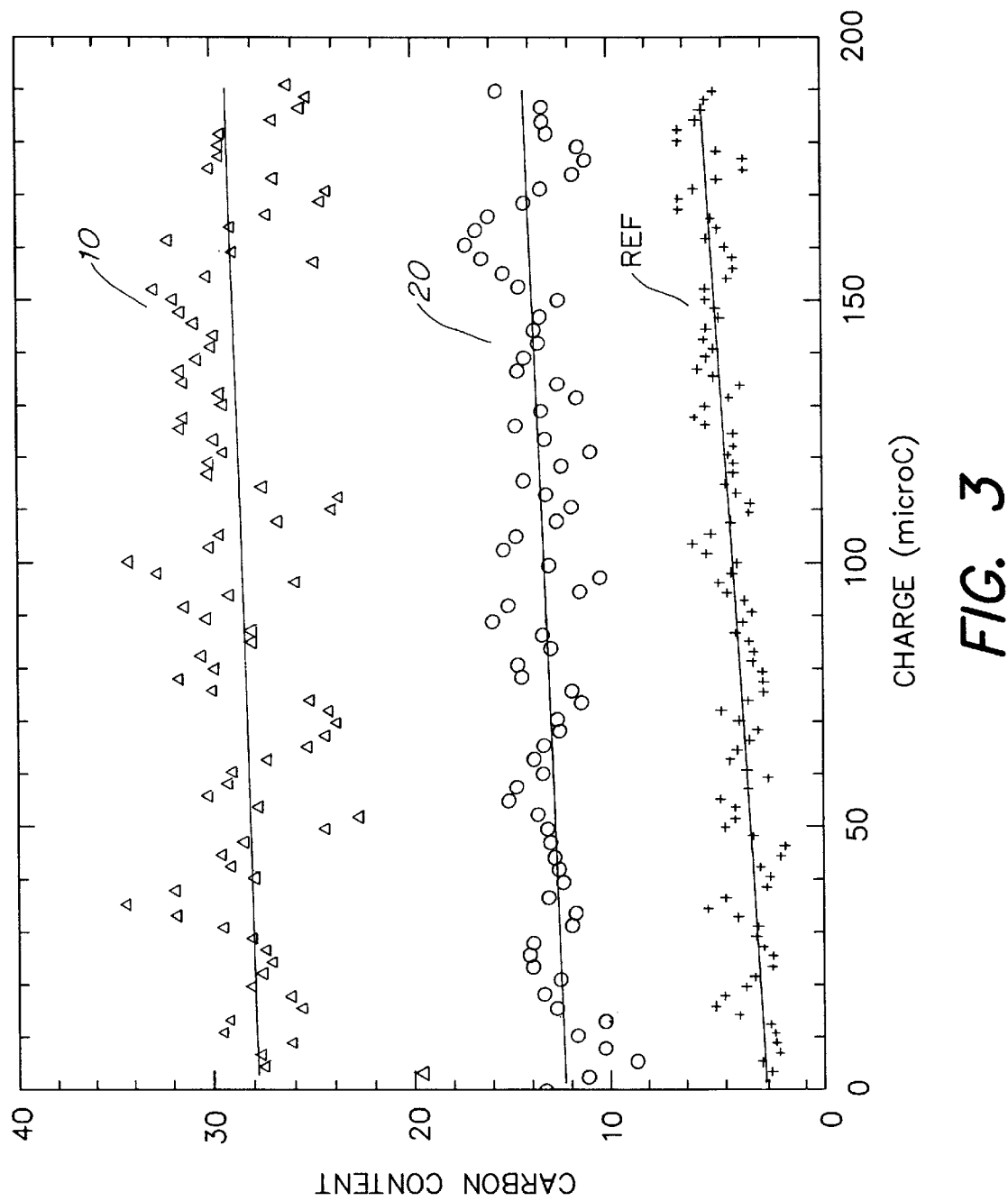
FIG. 3 shows nuclear reaction spectra for the two samples of FIG. 2.
Figure 4:
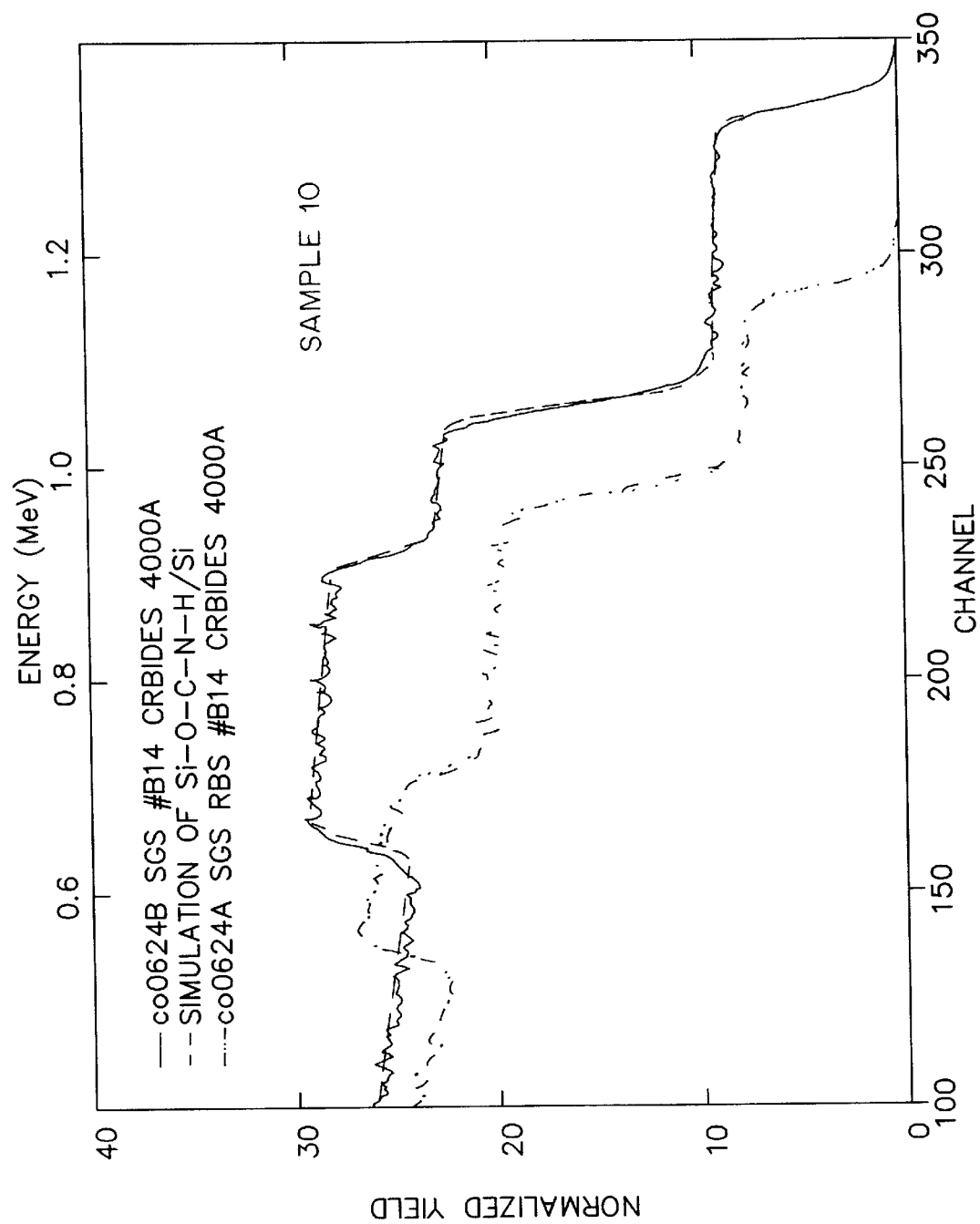
FIGS. 4 and 5 show, respectively, Rutherford Back Scattering (RBS) spectra of the two samples of FIG. 2.
Figure 5:
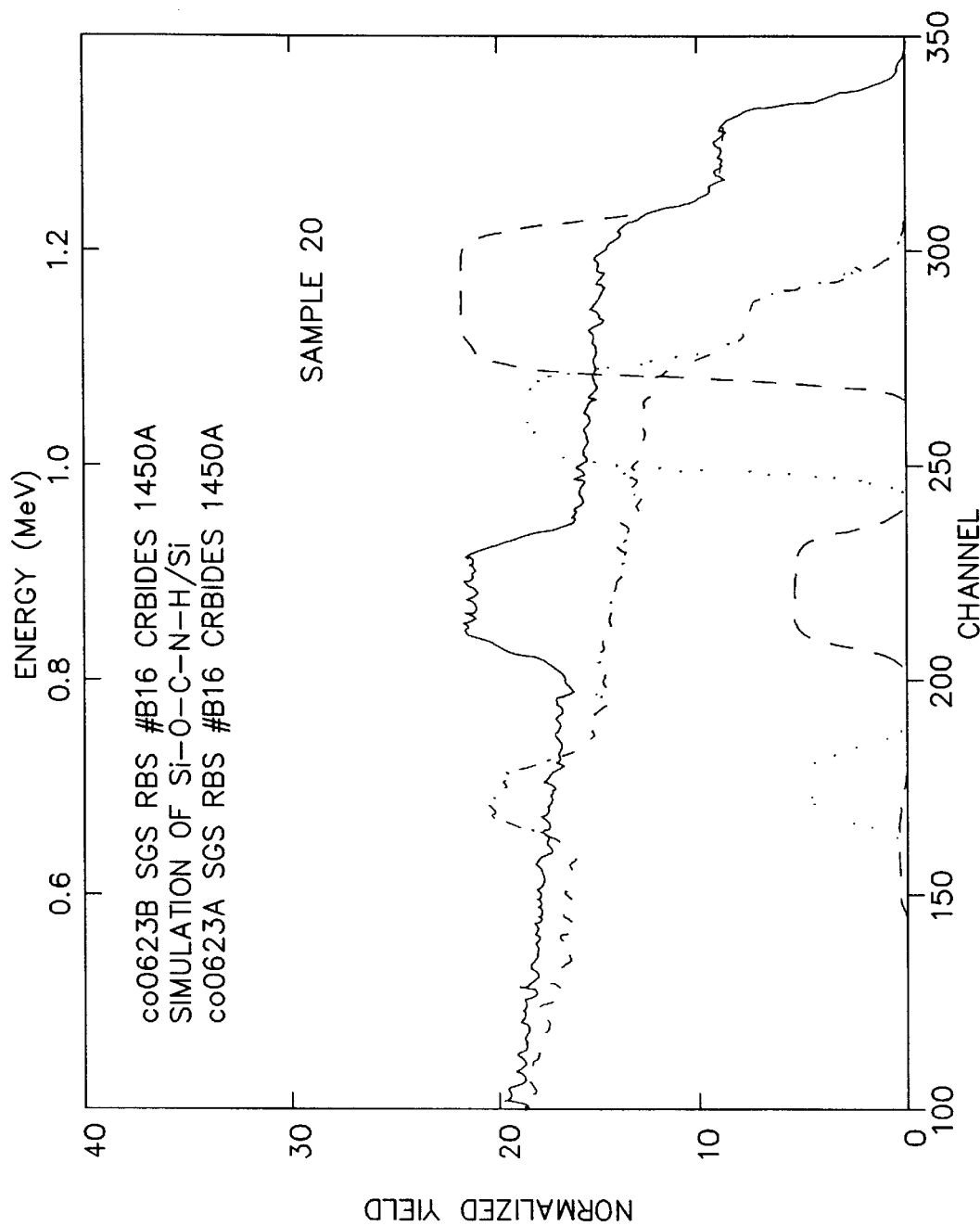

Two different adhesion compound samples formed with these parameters were analyzed to determine the composition of the adhesion layer. The two samples were obtained by large scale deposition on dielectric material. In FIGS. 2–5 the results are shown. The two samples are indicated by 10 and 20 in FIGS. 2–5 and differ in thickness, (i.e., 360 nm for the first (10) and 150 nm for the second (20)). The analyses were made using RBS (Rutherford Backscattering Spectrometry) to determine the silicon and oxygen concentrations using a beam of alpha particles in a particle accelerator. An ERDA analysis was used to define the hydrogen concentration, and an analysis of nuclear reactions caused by neutrons was employed to determine the content of oxygen, nitrogen and carbon. FIG. 2 shows a spectrum obtained by ERDA. The quantity of hydrogen, essentially negligible, is approximately the same as is present in a silicon oxide obtained by TEOS in accordance with a known technique. FIG. 3 shows the result of an analysis of nuclear reactions for the carbon. In particular, the variation of the concentration as a function of the charge during measurement is shown. The sample indicated by REF is used as reference. FIGS. 4 and 5 show the RBS spectra for the two specimens separately as achieved at two different angles and with superimposed simulated theoretical curves.

The average concentrations extracted by these measurements are summarized in Table 1 where they appear as units of $10^{21}$ atoms/cm$^3$.

TABLE 1

| Si | O | C | H |
|---|---|---|---|
| 21.0 | 39.5 | 3.47 | 1.09 |

In a typical example, an application of the process in accordance with the present invention is for an intermetal passivation step of an electronic device. The process calls initially for the formation of a first silicon oxide layer on a circuit structure. Formation of the silicon oxide takes place by plasma enhanced chemical vapour deposition, and using TEOS as precursor for the silicon. By translation we shall briefly indicate the compound obtained by TEOS. After deposition, an etching process follows as well as a successive surface cleaning performed by standard techniques. Next, a dielectric adhesion layer obtained by the process described above is formed and is followed by deposition of a second layer of TEOS.

The results of adhesion tests are shown in Table 2 and are compared with standard methods for adhesion improvement. The tests are performed by using a highly stressed layer comprising titanium and titanium nitride over the structure. As may be seen, only the structure comprising the adhesion layer in accordance with the present invention exhibits a negligible peeling area a few days after deposition of the titanium.

TABLE 2

| Process Used | Peeling Start time | Wafer peeling time | Area peeled after 120 h in cm$^2$ |
|---|---|---|---|
| EB: std clean + adhesion layer | 8–72 h | — | <0.1 |
| EB:100 W/30 mT/67 s | 20 min | 8–72h | — |
| EB:200 W/30 mT/34 s | <1 min | — | 130 |
| EB:450 W/30 mT/14 s | <1 min | — | 130 |
| EB:300 W/240 mT/38 s | <1 min | 3 h | — |
| EB:450 W/240 mT/21 s | <1 min | 5 h | — |
| EB:200 W/240 mT/102 s | <1 min | 3 h | — |
| EB:300 W/17 mT/20 s | 20 min | — | 100 |
| EB:: no clean | <1 sec | <1 min | — |
| EB:std | 3.25 h | — | 50 |

Figure 6:
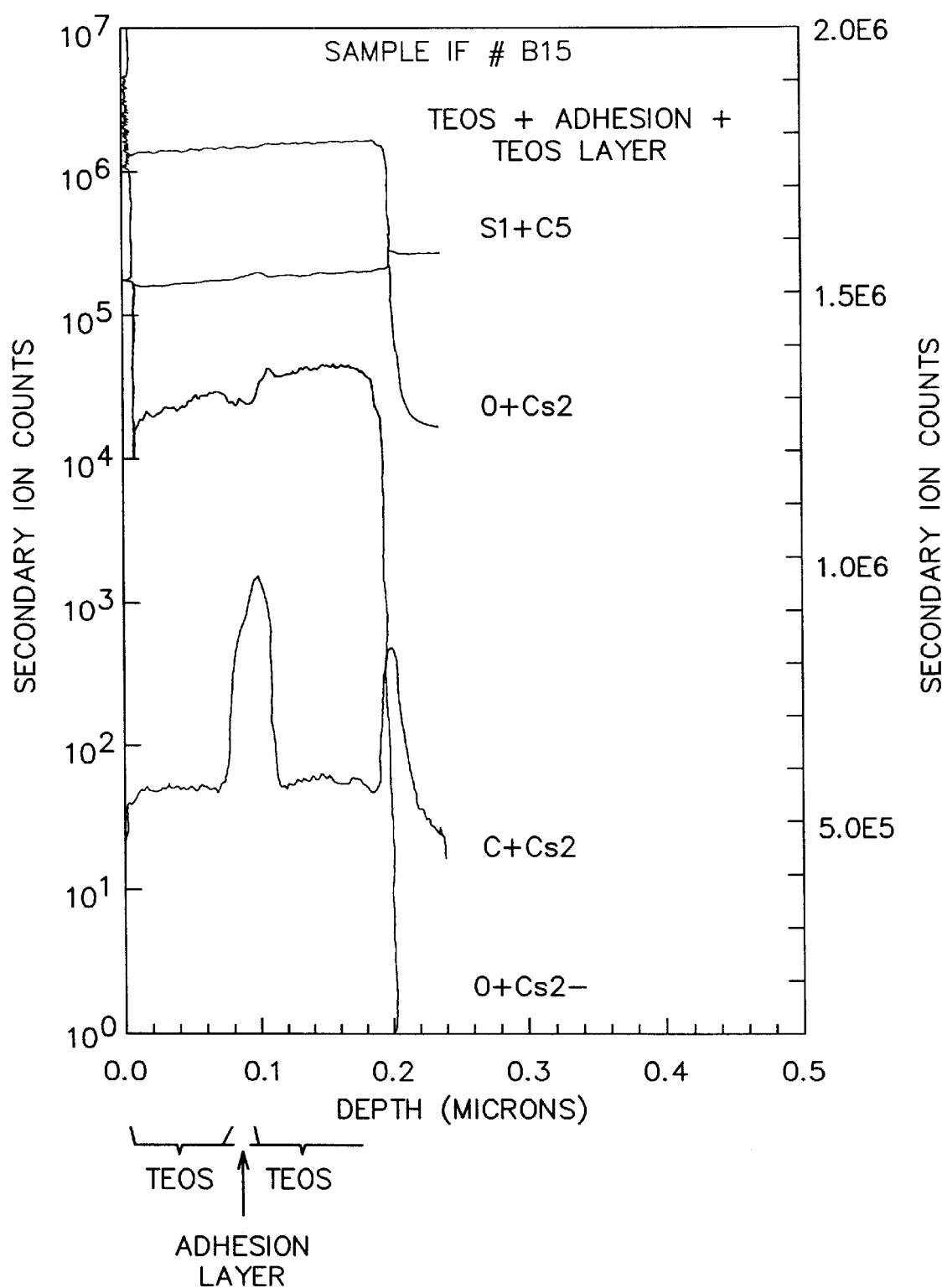
FIG. 6 shows a Secondary Ion Mass Specetry (SIMS) spectrum of a semiconductor device comprising two dielectric layers with an adhesion layer interposed therebetween in accordance with the present invention.

In addition, FIG. 6 shows the SIMS (Secondary Ion Mass Spectroscopy) spectrum performed on the same structure TEOS/adhesion layer/TEOS described above. This spectrum clearly shows the presence of carbon in the adhesion layer. It should be noted that, unlike nuclear measurements by SIMS, it is possible to determine quantitatively the concentration of the chemical elements in the layer directly on the finished device taking as standard those obtained by the quantitative nuclear measurements.

Having thus described particular embodiments of the present invention, various alterations, modifications, and improvements will readily occur to those skilled in the art. Such alterations, modifications, and improvements are intended to be part of this disclosure, and are intended to be within the spirit and scope of the invention. The materials employed, as well as their shapes and dimensions, may be any required. Accordingly, the foregoing description is by way of example only and is not intended as limiting. The invention is limited only as defined in the following claims and the equivalents thereto.

What is claimed is:

1. A semiconductor device, comprising:

a semiconductor substrate;

a first separate dielectric layer disposed on at least part of a structure formed in the semiconductor substrate;

a second separate layer also of a dielectric material and disposed over said first dielectric layer; and a separate adhesion layer disposed between the first dielectric layer and the second dielectric layer;

said adhesion layer providing improved adhesion between the first dielectric layer and the second dielectric layer;

said adhesion layer comprising a silicon oxide incorporating a predetermined percentage of carbon.

2. The semiconductor device of claim 1, wherein the adhesion layer comprises from $15*10^{21}$ to $27*10^{21}$ atoms/cm$^3$ of silicon.

3. The semiconductor device of claim 1, wherein the adhesion layer comprises from $28*10^{21}$ to $50*10^{21}$ atoms/cm$^3$ of oxygen.

4. The semiconductor device of claim 1, wherein the composition of matter comprises from $2.5*10^{21}$ to $4.5*10^{21}$ atoms/cm$^3$ of carbon.

5. The semiconductor device of claim 1, further comprising from $0.8*10^{21}$ to $1.3*10^{21}$ atoms/cm$^3$ of hydrogen.

6. The semiconductor device of claim 1, wherein the first dielectric layer comprises a material selected from the group consisting of silicon oxide, silicon oxynitride, silicon nitride and mixtures thereof and the second dielectric layer comprises a material selected from the group consisting of silicon oxide, silicon oxynitride, silicon nitride and mixtures thereof.

7. The semiconductor device of claim 1, wherein the adhesion layer is capable of being placed on a layer of material without substantial peeling.

8. The semiconductor device of claim 7, wherein the layer of material has a tensile strength of at least the tensile strength of tungsten.

9. The semiconductor device of claim 7, wherein the layer of material has a compressive strength of at most that of tungsten.

10. The semiconductor device of claim 1, wherein the adhesion layer comprises:

from $15*10^{21}$ to $27*10^{21}$ atoms/cm$^3$ of silicon;

from $28*10^{21}$ to $50*10^{21}$ atoms/cm$^3$ of oxygen; and from $2.5*10^{21}$ to $4.5*10^{21}$ atoms/cm$^3$ of carbon.

11. The semiconductor device of claim 1, further comprising from $0.8*10^{21}$ to $1.3*10^{21}$ atoms/cm$^3$ of hydrogen.

12. The semiconductor device of claim 1, wherein the adhesion layer comprises a layer having a thickness between 1 nm and 50 nm.

13. The semiconductor device of claim 1, wherein the adhesion layer comprises a layer having a thickness between 5 nm and 50 nm.

14. The semiconductor device of claim 1, wherein the adhesion layer is thinner than either of the dielectric layers.

15. The semiconductor device of claim 1, wherein said adhesion layer comprises a non-stoichiometric silicon oxide.

16. The semiconductor device of claim 1, wherein said adhesion layer is formed at a temperature of less than 500° C. and in atmosphere kept essentially free of exogenous oxidative substances.

17. The semiconductor device of claim 1, wherein said adhesion layer comprises a ternary compound of silicon, oxygen and carbon.

18. The semiconductor device of claim 1, wherein said adhesion layer is formed by plasma enhanced chemical vapor deposition.

19. The semiconductor device of claim 1, wherein the concentration of carbon in atoms/centimeter$^3$ is less than the concentration of either silicon or oxygen.

* * * * *